United States Patent [19]

Matsuda et al.

[11] Patent Number: 5,760,591
[45] Date of Patent: Jun. 2, 1998

[54] METHOD OF AND APPARATUS FOR DETERMINING AN ELECTRIC WIRING STATE

[75] Inventors: Shin-ichiro Matsuda, 204, Laionzu-mansyon-sugeta-dai-2, 450-1, Sugeta-cho, Kanagawa-ku, Yokohama-shi, Kanagawa-ken; Tomoatsu Ino, Kanagawa-ken, both of Japan

[73] Assignee: Shin-Ichiro Matsuda, Kanagawa-ken, Japan

[21] Appl. No.: 77,993

[22] Filed: Jun. 18, 1993

[30] Foreign Application Priority Data

Jun. 18, 1992 [JP] Japan .................. 4-159650

[51] Int. Cl.[6] ............................................. G01R 31/08
[52] U.S. Cl. ............................ 324/524; 324/66; 324/521
[58] Field of Search .................... 324/524, 66, 528, 324/529, 530, 133, 521

[56] References Cited

U.S. PATENT DOCUMENTS

| 3,924,179 | 12/1975 | Dozier | 324/66 |
| 4,115,731 | 9/1978 | Axtell | 324/528 |
| 4,445,085 | 4/1984 | Metcalf | 324/524 |
| 4,852,174 | 7/1989 | Bouchard | 324/66 |

FOREIGN PATENT DOCUMENTS

| 1162811 | 8/1969 | United Kingdom | 624/66 |

*Primary Examiner*—Ernest F. Karlsen
*Assistant Examiner*—Jose M. Solis
*Attorney, Agent, or Firm*—Lowe, Price, LeBlanc & Becker

[57] ABSTRACT

A method of and an apparatus for determining an electric wiring state, having the steps of: feeding at least one pulse voltage signal into one of two lines short-circuited at their two source portions; detecting the pulse voltage signal at two end portions corresponding to the two source portions; and discriminating wiring state between the two source portions and the corresponding two end portions upon a comparison of polarities between the fed pulse voltage signal and the detected signal.

19 Claims, 8 Drawing Sheets

METHOD OF AND APPARATUS FOR DETERMINING AN ELECTRIC WIRING STATE

BACKGROUND OF THE INVENTION

1. Field of the Invention

This invention is broadly concerned with a method of and an apparatus for determining whether an electric wiring is in a state as previously expected or not and intended particularly to be used to determine a wiring state in a so-called three-wiring system electric source wiring having a protective ground line.

2. Description of the Related Art

Various electric wiring for power supply, communication and indoor facilities control have previously been established in a building. Most typical wiring is severally prepared wall sockets in the building each of which is connected to an electric distributor or an electric trans connection device via a properly provided house-wiring. The house-wiring from the electric trans connection device generally employs a two-wire system consisting of an electric power line and a neutral line or a three-wire system including a protective ground line to externally ground for an effective security measure and a countermeasures in noise.

The known three-wiring systems are, for example, (1): a three-phase four-wiring system defined by three electric power lines E, one neutral line N and a ground line G as shown in FIG. 13, (2): a three-phase three-wiring system defined by two electric power lines E, one neutral line N and one ground line G as shown in FIG. 14, and (3): a single-phase three-wiring system defined by two electric power lines E, one neutral line N and one ground line G as shown in FIG. 15. When used one of the mentioned three-wiring systems for wall sockets, a so-called three-terminal post socket consisting of an electric power post e, a neutral post n and a ground post g may be generally employed, wherein each post relates to any one of the electric power line E, the neutral line N or the ground line G, respectively.

However, if such a house-wiring is done in fault, electrical appliances will not be put into operation or hardly damaged thereby due to an abnormal voltage. It is therefore inevitable to confirm or determine an actual wiring state between a source portion to an end portion after the wiring work is done.

As a generally known method to determine the actual wiring state, there has been proposed to use a tester to detect a live voltage at any point of the end portion on the each line or at each post of the wall socket in a live state. More specifically, in order to confirm the live wiring state, a voltage test to sense a live voltage between two posts and then determine whether the thus-measured voltage value belongs to a predetermined value, a polarity test to confirm a polarity at each post and a ground test to confirm whether the ground post is certainly grounded, are respectively conducted.

As, in the aforementioned conventional method of determining the wiring state, a fault wiring can be known only based on a measurement result after detecting voltage at respective end portions on the lines, so that when respective voltage values at end portions on the ground line and the neutral line are detected, they will result in almost the same value since both the ground line and the neutral line are naturally short-circuited at the source portions thereof.

It will be noted in Table 1 that there are various connection combinations at a wall socket for a power supply wiring in the three-phase four wiring system. Table 1 is incorporated herein to show respective voltage conditions between two of three posts of the wall socket in every connection combinations. In Table 1, the mark "V1" means a voltage value condition between the electric power post e and the ground post g, the mark "V2" means a voltage value condition between the electric power post e and the neutral post n, and the mark "V3" means a voltage value condition between the neutral post n and the ground post g.

Incidentally, the mark or figure "0 (zero)" means that a measured voltage between two of three posts in the wall socket is 0 (zero) value as a constant voltage value between the neutral line N and the ground line G. The mark "R" means that a measured voltage between two of three posts is at the regular voltage value as a constant voltage value between the electric power line E and the neutral line N or between the electric power line E and the ground line G. The mark "H" means a higher voltage value condition than the regular voltage value, which results in that the detected voltage value is a voltage between any two of the different electric power lines E in the three-phase four-wiring system or the single-phase three-wiring system.

TABLE 1

| e | n | g | V1 | V2 | V3 | e | n | g | V1 | V2 | V3 | e | n | g | V1 | V2 | V3 |
|---|---|---|----|----|----|---|---|---|----|----|----|---|---|---|----|----|----|
| E | E | E | H  | H  | H  | N | E | E | R  | R  | H  | G | E | E | R  | R  | H  |
|   |   |   | H  | H  | O  |   |   |   | R  | R  | O  |   |   |   | R  | R  | O  |
|   |   |   | H  | O  | H  | N | E | N | O  | R  | R  | G | E | N | O  | R  | R  |
|   |   |   | O  | H  | H  | N | E | G | O  | R  | R  | G | E | G | O  | R  | R  |
|   |   |   | O  | O  | O  | N | N | E | R  | O  | R  | G | N | E | R  | O  | R  |
| E | E | N | R  | H  | R  | N | N | N | O  | O  | O  | G | N | N | O  | O  | O  |
|   |   |   | R  | O  | R  | N | N | G | O  | O  | O  | G | N | G | O  | O  | O  |
| E | E | G | R  | H  | R  | N | G | E | R  | O  | R  | G | G | E | R  | O  | R  |
|   |   |   | R  | O  | R  | N | G | N | O  | O  | O  | G | G | N | O  | O  | O  |
| E | N | E | H  | R  | R  | N | G | G | O  | O  | O  | G | G | G | O  | O  | O  |
|   |   |   | O  | R  | R  |   |   |   |    |    |    |   |   |   |    |    |    |
| E | N | N | R  | R  | O  |   |   |   |    |    |    |   |   |   |    |    |    |
| E | N | G | R  | R  | O  |   |   |   |    |    |    |   |   |   |    |    |    |

TABLE 1-continued

| e | n | g | V1 | V2 | V3 | e | n | g | V1 | V2 | V3 | e | n | g | V1 | V2 | V3 |
|---|---|---|----|----|----|---|---|---|----|----|----|---|---|---|----|----|----|
| E | G | N | H  | R  | R  |   |   |   |    |    |    |   |   |   |    |    |    |
|   |   |   | O  | R  | R  |   |   |   |    |    |    |   |   |   |    |    |    |
| E | G | N | R  | R  | O  |   |   |   |    |    |    |   |   |   |    |    |    |
| E | G | G | R  | R  | O  |   |   |   |    |    |    |   |   |   |    |    |    |

As can be understood in Table 1, when the finished wiring is in a correct "eng=ENG" state, the detected voltage values V1, V2, V3 shall be shown with "R", "R", "O". On the contrary, if the three voltage values do not shown with the marks "RRO", the finished wiring can be determined as being in a fault state. However, the same marks "RRO" can be apparently seen in Table 1 when the three-phase four-wiring system is completed in one connection combination of "ENN", "EGN", "EGG", "NEE" and "GEE".

Table 2 further shows voltage value conditions between two of three posts at the wall socket in every connection combinations for a power supply wiring in the three-phase three wiring system depicted in FIG. 14.

TABLE 2

| e | n | g | V1 | V2 | V3 | e | n | g | V1 | V2 | V3 | e | n | g | V1 | V2 | V3 |
|---|---|---|----|----|----|---|---|---|----|----|----|---|---|---|----|----|----|
| E | E | E | R  | R  | O  | N | E | E | R  | R  | R  | G | E | E | R  | R  | R  |
|   |   |   | R  | O  | R  |   |   |   | R  | R  | O  |   |   |   | R  | R  | O  |
|   |   |   | O  | R  | R  | N | E | N | O  | R  | R  | G | E | N | O  | R  | R  |
|   |   |   | O  | O  | O  | N | E | G | O  | R  | R  | G | E | G | O  | R  | R  |
| E | E | N | R  | R  | R  | N | N | E | R  | O  | R  | G | N | E | R  | O  | R  |
|   |   |   | R  | O  | R  | N | N | N | O  | O  | O  | G | N | N | O  | O  | O  |
| E | E | G | R  | R  | R  | N | N | G | O  | O  | O  | G | N | G | O  | O  | O  |
|   |   |   | R  | O  | R  | N | G | E | R  | O  | R  | G | E | R | O  | O  | R  |
| E | N | E | R  | R  | R  | N | G | N | O  | O  | O  | G | N | O | O  | O  | O  |
|   |   |   | O  | R  | R  | N | G | G | O  | O  | O  | G | G | O | O  | O  | O  |
| E | N | N | R  | R  | O  |   |   |   |    |    |    |   |   |   |    |    |    |
| E | N | G | R  | R  | O  |   |   |   |    |    |    |   |   |   |    |    |    |
| E | G | E | R  | R  | R  |   |   |   |    |    |    |   |   |   |    |    |    |
|   |   |   | O  | R  | R  |   |   |   |    |    |    |   |   |   |    |    |    |
| E | G | N | R  | R  | O  |   |   |   |    |    |    |   |   |   |    |    |    |
| E | G | G | R  | R  | O  |   |   |   |    |    |    |   |   |   |    |    |    |

The following Table 3 also shows voltage value conditions between two of three posts at the wall socket in every connection combinations for a power supply wiring in the single-phase three wiring system is depicted in FIG. 15.

TABLE 3

| e | n | g | V1 | V2 | V3 | e | n | g | V1 | V2 | V3 | e | n | g | V1 | V2 | V3 |
|---|---|---|----|----|----|---|---|---|----|----|----|---|---|---|----|----|----|
| E | E | E | H  | H  | O  | N | E | E | R  | R  | H  | G | E | E | R  | R  | H  |
|   |   |   | H  | O  | H  |   |   |   | R  | R  | O  |   |   |   | R  | R  | O  |
|   |   |   | O  | H  | H  | N | E | N | O  | R  | R  | G | E | N | O  | R  | R  |
|   |   |   | O  | O  | O  | N | E | G | O  | R  | R  | G | E | G | O  | R  | R  |
| E | E | N | R  | H  | R  | N | N | E | R  | O  | R  | G | N | E | R  | O  | R  |
|   |   |   | R  | O  | R  | N | N | N | O  | O  | O  | G | N | N | O  | O  | O  |
| E | E | G | R  | H  | R  | N | N | G | O  | O  | O  | G | N | G | O  | O  | O  |
|   |   |   | R  | O  | R  | N | G | E | R  | O  | R  | G | E | R | O  | O  | R  |
| E | N | E | H  | R  | R  | N | G | N | O  | O  | O  | G | N | O | O  | O  | O  |
|   |   |   | O  | R  | R  | N | G | G | O  | O  | O  | G | G | O | O  | O  | O  |
| E | N | N | R  | R  | O  |   |   |   |    |    |    |   |   |   |    |    |    |

TABLE 3-continued

| e | n | g | V1 | V2 | V3 | e | n | g | V1 | V2 | V3 | e | n | g | V1 | V2 | V3 |
|---|---|---|----|----|----|---|---|---|----|----|----|---|---|---|----|----|----|
| E | N | G | R  | R  | O  |   |   |   |    |    |    |   |   |   |    |    |    |
| E | G | E | O  | R  | R  |   |   |   |    |    |    |   |   |   |    |    |    |
| E | G | N | R  | R  | O  |   |   |   |    |    |    |   |   |   |    |    |    |
| E | G | G | R  | R  | O  |   |   |   |    |    |    |   |   |   |    |    |    |

As can be understood from Tables 2 and 3, there are 6 connection combinations in the three-phase three wiring system and 5 connection combinations in the single-phase three wiring system to show the marks "RRO" which means, as it were, a correct wiring state. Accordingly, the aforementioned voltage test is not a sufficient method to determine whether the actual wiring state is correct or not.

The above-mentioned method to determine a wiring state has been replaced with another one wherein the determination was done by measuring an electric current after temporarily short-circuiting or earthing from the electric power line to the neutral line and the ground line. But, this method should be carried out under an interruption state of the lines, otherwise, under a hot-line state, such temporary short-circuit may cause a sudden voltage drop to make a bad influence on live electrical appliances or to result in an interruption of service by a protective relay.

As a simple testing method, there has been a known method wherein a electrical continuity test between the source portion and the end portion for each line is done. However, this type test needs two persons at the source and end portions respectively, which is disadvantage in view of a working efficiency.

These above-mentioned disadvantages can be realized when confirming a finished wiring state not only under the aforementioned three-wiring system but also under the other systems including two lines short-circuited at the source portions thereof.

An object of the present invention is to provide a method and an apparatus for correctly and safely confirming or determining a finished electric wiring state wherein each of two lines is short-circuited at its source portion, even if the finished lines are still in a live state.

SUMMARY OF THE INVENTION

This invention is a method of determining an electric wiring state, comprising the steps of: feeding at least one pulse voltage signal into one of two lines short-circuited at their two source portions; detecting the pulse voltage signal at two end portions corresponding to the two source portions; and discriminating wiring state between the two source portions and the corresponding two end portions upon a comparison of polarities between the fed pulse voltage signal and the detected signal.

The discrimination is provided to determine a correct wiring state of the two lines when a polarity of the detected signal is the same to that of the fed pulse voltage signal. The discrimination is provided to determine a reversed wiring state of the two lines when a polarity of the detected signal is oppose to that of the fed pulse voltage signal. The discrimination is adapted to discriminate that the two end portions are all connected to one of the two lines when there is no signal detection at the end portions. The discrimination is conducted before a comparison of polarities between the fed pulse voltage signal and the detected signal. This method further comprises a step to measure voltage values at end portions connected to the two lines and an electric power line to confirm with the predetermined values. Incidentally, the fed pulse voltage signal is a sine wave pulse. The fed pulse voltage signal is a combined sine wave pulse with an antiphase pulse thereof. The fed pulse voltage signal is formed into a U-shaped pulse. The pulse voltage signal has a frequency of 5 KHz.

The apparatus according to this invention comprises an oscillation device for feeding at least one pulse voltage signal into one of two lines short-circuited at their two source portions; and an discrimination device for detecting the signal at two end portions corresponding to the two source portions and discriminating polarities of the fed pulse voltage signal and the detected signal.

The oscillation device includes a trans connection device to feed the pulse voltage signal in one of the two lines in a clamping state of the line. The discrimination device includes a polarity distinction circuit adapted to sense a plus element and minus element of the fed pulse voltage signal from the two end portions to thereby distinguish a straight polarity when the order of the elements are the same to that from the oscillation device and a reversed polarity when the order of the elements are oppose to that from the oscillation device. The discrimination device has a filter circuit to cancel a power supply frequency element generated in the lines. Incidentally, the discrimination device is located between the filter circuit and the end portions and has a relay circuit to connect between the end portions at predetermined voltage value. The predetermined voltage value is preferably 0 (zero). The discrimination device includes a silence distinction circuit to compare the signal from the lines with the pulse voltage signals from the oscillation device to thereby issue a discrimination as there is no signal when it does not have a confirmation that the pulse signals originates from the oscillation device. The discrimination device includes a voltage value measurement circuit adapted to confirm voltage values at end portions connected to the two lines and an electric power line with predetermined values.

DETAILED DESCRIPTION OF THE PREFERRED EMBODIMENT(S)

Figure 1:
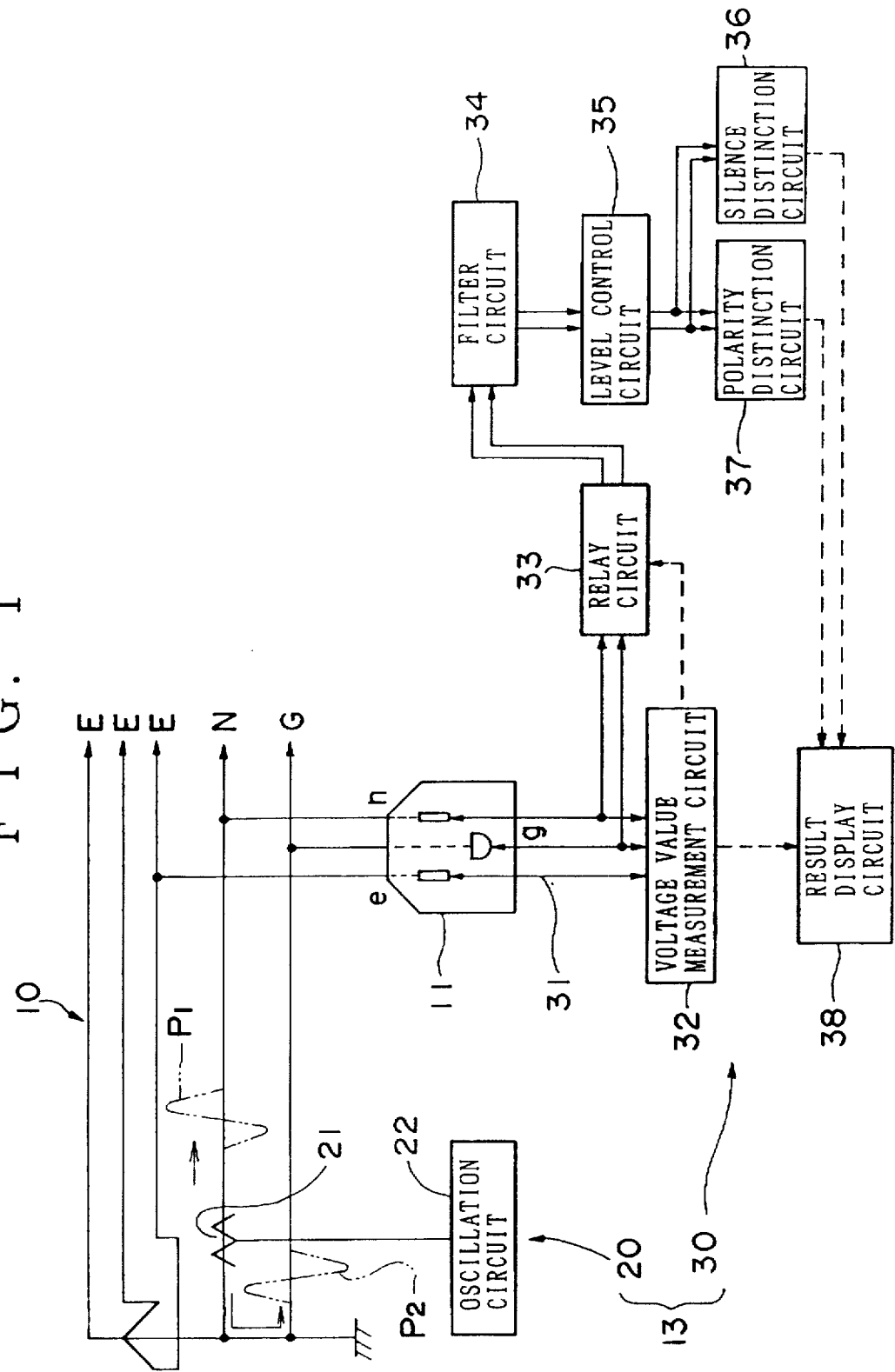
FIG. 1 is a diagrammatic view depicting the most preferable embodiment according to the present invention.

The most preferable embodiment of the present invention will now be described with reference to the drawings. FIG. 1 depicts a preferable connection state of a determination system 13 according to the present invention with a three-terminal post socket 11 wherein three posts e, n, g are respectively connected with an electric wiring 10 under the three-phase four-wiring system defined by an electric power line E, a neutral line N and a ground line G to thereby confirm or determine the finished wiring state. In the following descriptions, the neutral line N and ground line G short-circuited at their source portions will be mentioned just as "two lines" and corresponding neutral post n and ground post g in the three-terminal post socket will be also mentioned just as "two posts".

The determination system 13 comprises an oscillation device 20 to generate and send pulse voltage signals into the neutral line N at its source portion and a discrimination device 30 connected to the posts e, n, g of the three-terminal post socket 11. The oscillation device 20 has a trans connection device 21 capable of clamping the neutral line N on its preferable portion and an oscillation circuit 22 to generate and send the pulse voltage signals intermittently to the trans connection device 21 thus to generate induced voltage signals related to the generated signals in the neutral line N or the ground line G. The thus-sent induced voltage signal is separated into an induced voltage signal P1 advancing to the post n through the neutral line N and an induced voltage signal P2 oppositely advancing to the post g through the neutral line N and the ground line G, the polarity of the induced voltage signal P1 and that of the induced voltage signal P2 being quite the opposite since advancing directions thereof are different to each other.

Figure 2:
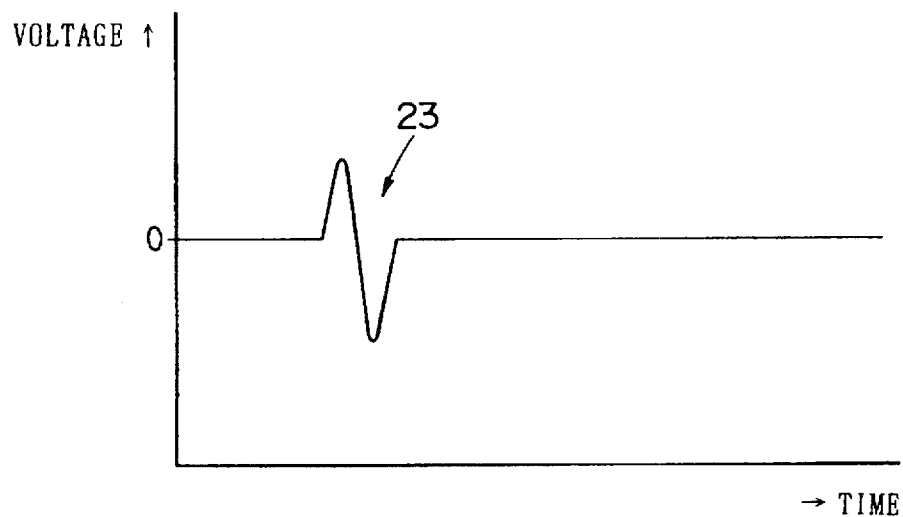
FIG. 2 is a graphical representation showing a fundamental wave shape of a pulse voltage signal used in the embodiment.

The signal generated in the oscillation device 20 is preferably a single sine wave pulse 23 of 5 KHz as depicted in FIG. 2. However, in a practice, the single sine wave pulse 23 should be accompanied with another sine wave pulse 24 negative to the single sine wave pulse 23 as to be a signal 25 depicted in FIG. 3 so as to cancel a transient response hereinafter described in detail. The discrimination device 30 is defined by coupling cables 31 connecting to the posts e, n, g of the three-terminal post socket 11, a voltage value measurement circuit 32, a relay circuit 33, a filter circuit 34, a level control circuit 35, a silence distinction circuit 36, a polarity distinction circuit 37 and a result display circuit 38.

The voltage value measurement circuit 32 is provided to connect to the posts e, n, g via the coupling cables 31 to measure respective voltage values between the two ports such as e-g, e-n and n-g successively and output the measurement result thereafter. As a result, the connection combinations between the posts e, n, g and the lines E, N, G can be limited as to show "RRO" state as shown in Tables 1–3.

The relay circuit 33 functions to connect or disconnect the coupling cables 31 from the posts n, g with the filter circuit 34 wherein the lines therebetween can be in a live state only when the voltage value between the posts n-g detected by the voltage value measurement circuit 32 is kept at a predetermined one, that is, at zero(0) to thereby prevent a high voltage between the posts E-N or the posts E-G toward other circuits 35, 36, 37.

Figure 3:
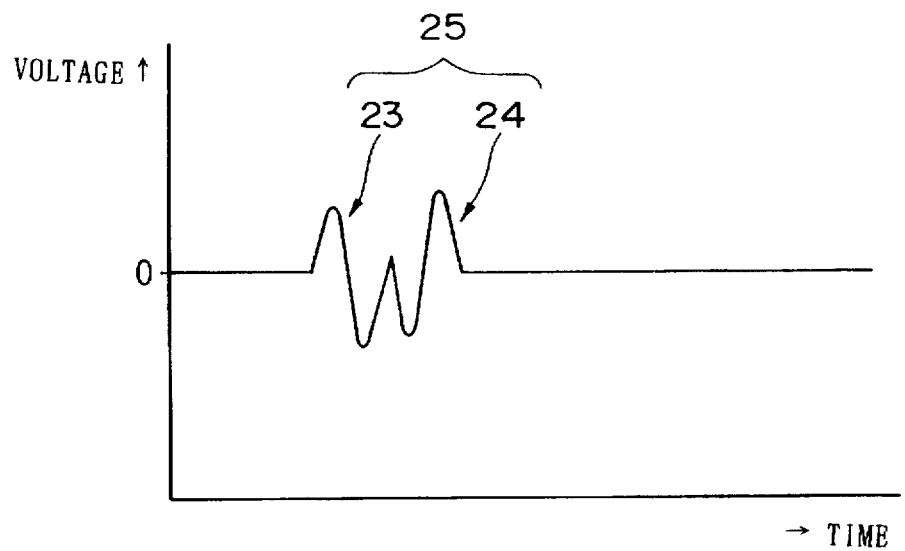
FIG. 3 is a graphical representation showing an actual wave shape used in the embodiment.
Figure 4:
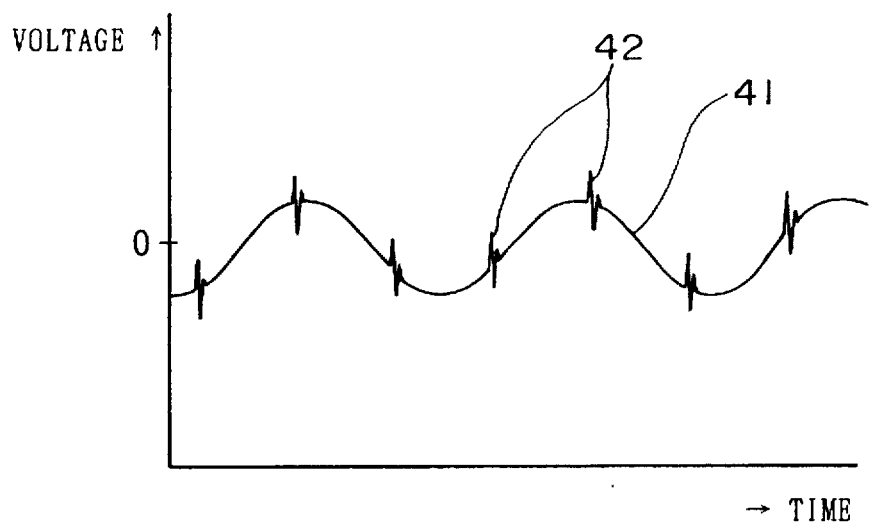
FIG. 4 is a graphical representation showing a signal wave shape fed into a filter circuit.
Figure 5:
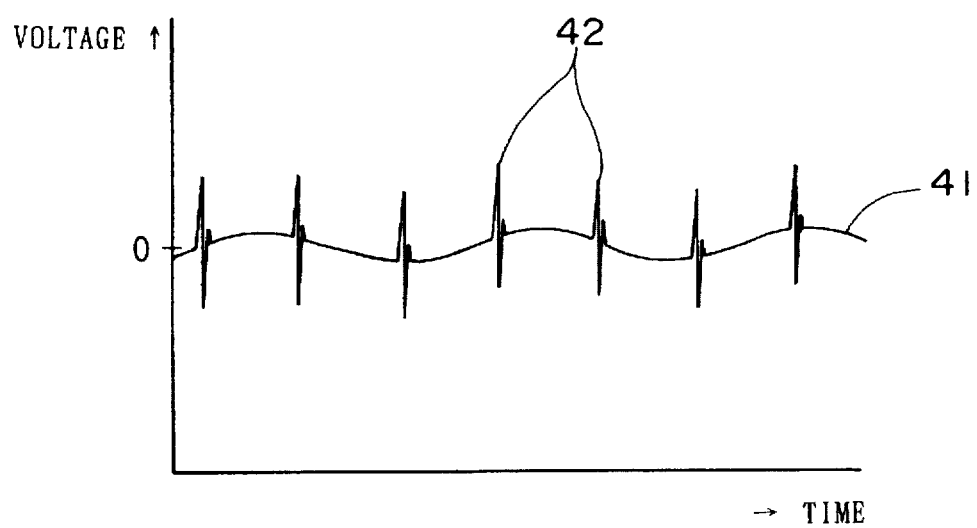
FIG. 5 is a graphical representation showing a processed signal wave shape in the filter circuit.
Figure 6:
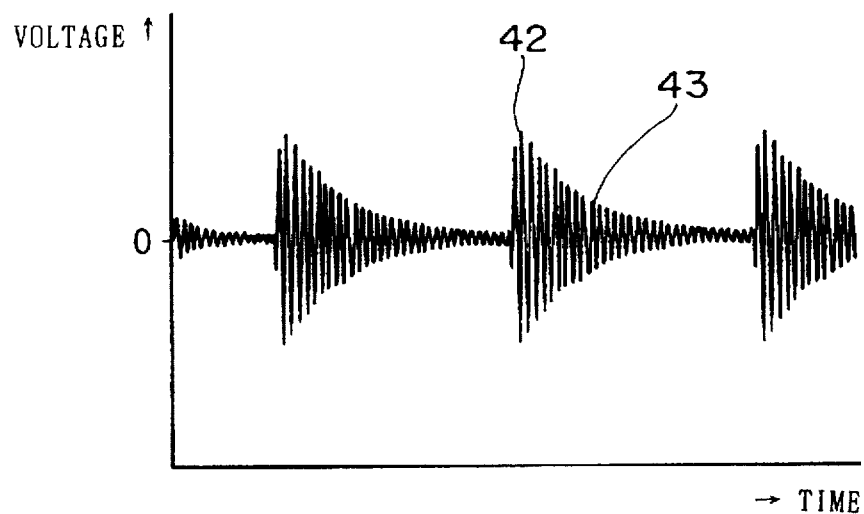
FIG. 6 is a graphical representation showing an output signal wave shape of the signal depicted in FIG. 2 after the filter circuit.
Figure 7:
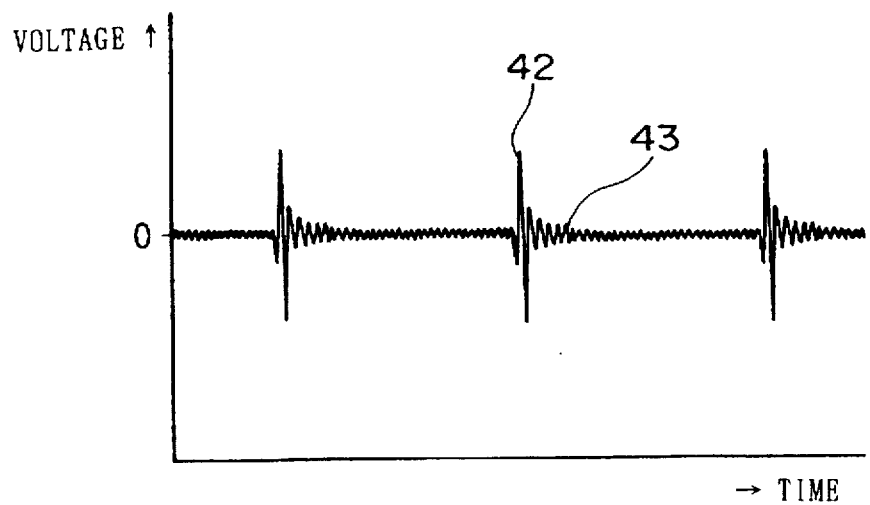
FIG. 7 is a graphical representation showing an output signal wave shape of the signal depicted in FIG. 3 after the filter circuit.

The filter circuit 34 comprises a 50 Hz notch filter canceling a base wave 41 as a power supply frequency element due to a load return current in the neutral line N and a 5 KHz band pass filter picking up pulse elements 42 as shown in FIG. 4. A wave shape of the induced voltage signal shown in FIG. 4 can be modified into that in FIG. 5 by the 50 Hz notch filter of the filter circuit 34, wherein the base wave 41 is restrained and the respective pulse elements 42 are remarkably emphasized. When the generated signal wave is the single sine wave pulse 23 as depicted in FIG. 2, a wave shape of the induced voltage signal after the 5 KHz band pass filter of the filter circuit 34 presents transient responses 43 as can be noted in FIG. 6, wherein the pulse elements 42 are not definitely defined. As the signal 25 depicted in FIG. 3 will be used, the negative sine wave pulse 24 accompanied to the aforementioned single sine wave pulse 23 can cancel the unacceptable transient response 43 to thereby positively pick up pulse elements 42 of the induced voltage signal as shown in FIG. 7.

The level control circuit 35 is provided for an inspection of a peak level of the pulse elements 42 obtained in the filter circuit 34, so that the pulse elements 42 in the silence distinction circuit 36 and the polarity distinction circuit 37 will be in a fine state to be examined therein.

The silence distinction circuit 36 is provided to compare the pulse elements 42 transmitted from the level control circuit 35 with the pulse voltage signals originally generated in the oscillation device 20 thus to issue a discrimination therefrom as there is no signal when it does not have a confirmation that the pulse elements 42 originates from the oscillation device 20. More specifically, as the pulse voltage signal is detected at each post n, g, the number of the pulse elements 42 should be counted one time in the signal generation cycle of the oscillation device 20. But, if the pulse voltage signal can not be obtained, transient responses because of noises are will be detected as the pulse elements 42, so that an operator can determine the present state based on the counted pulse elements in the signal generation cycle.

The polarity distinction circuit 37 is provided for detecting the order of plus and minus components of the pulse elements 42 sent from the level control circuit 35, wherein as the detected order is the same as that originally sent from the oscillation device 20, it results in a straight polarity and wherein as the detected order is reverse to that from the oscillation device 20, it results in a reversed polarity. More specifically, the received pulse element 42 is separated into two and one of two pulse half-element is reversed. The both pulse half-elements are deformed into U-shaped pulses through a comparator, so that the order of arrival of the two pulse elements can be determined through a prepared logic.

Figure 8:
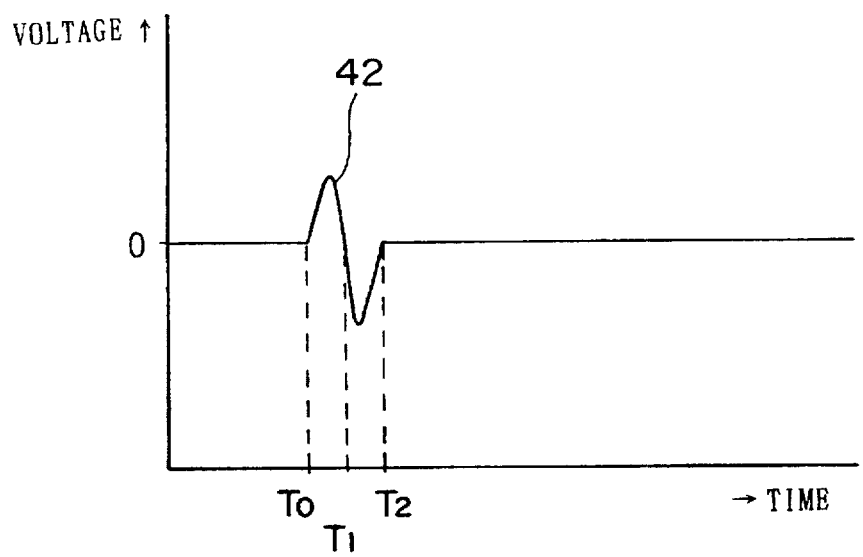
FIG. 8 is a graphical representation showing a straight polarity signal wave toward a polarity distinction circuit.
Figure 10:
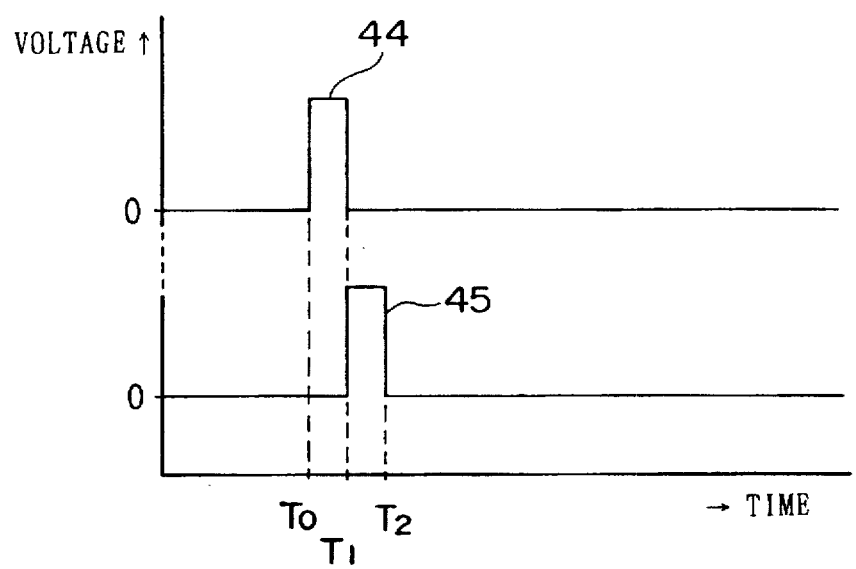
FIG. 10 is a graphical representation showing a deformed straight polarity signal wave in the polarity distinction circuit.

Accordingly, as the order of the two pulse half-elements is the plus one and the minus one as depicted in FIG. 8, the plus pulse half-element comes out between time T0 and T1 and the minus pulse half-element comes out between time T1 and T2. In practice, as the plus pulse half-element is not turned over and the minus pulse half-element is turned over and then both pulse half-elements are deformed into U-shaped ones respectively, the pulse half-elements are presented as a non-reverse output 44 and a reverse output 45, the non-reverse output 44 being first detected at time T0 as can be seen from FIG. 10. At this moment, the straight polarity is now to be acknowledged.

Figure 9:
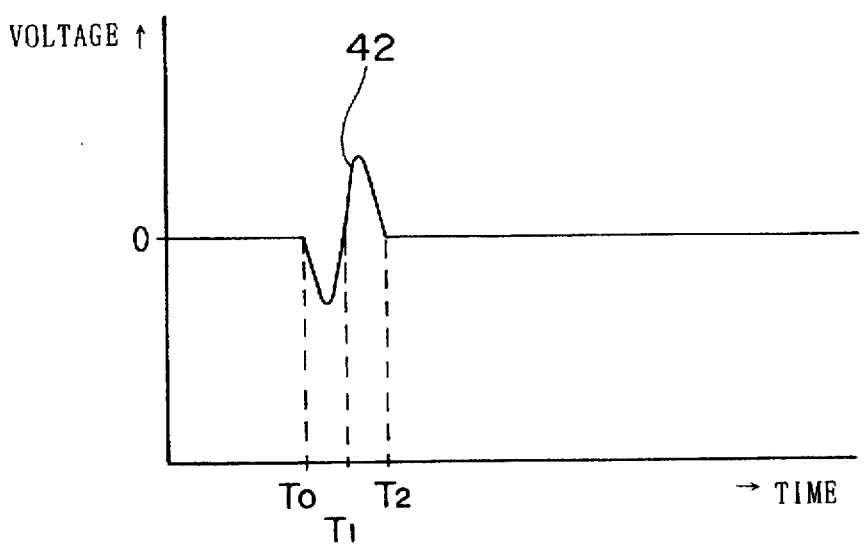
FIG. 9 is a graphical representation showing a reversed polarity signal wave toward a polarity distinction circuit.
Figure 11:
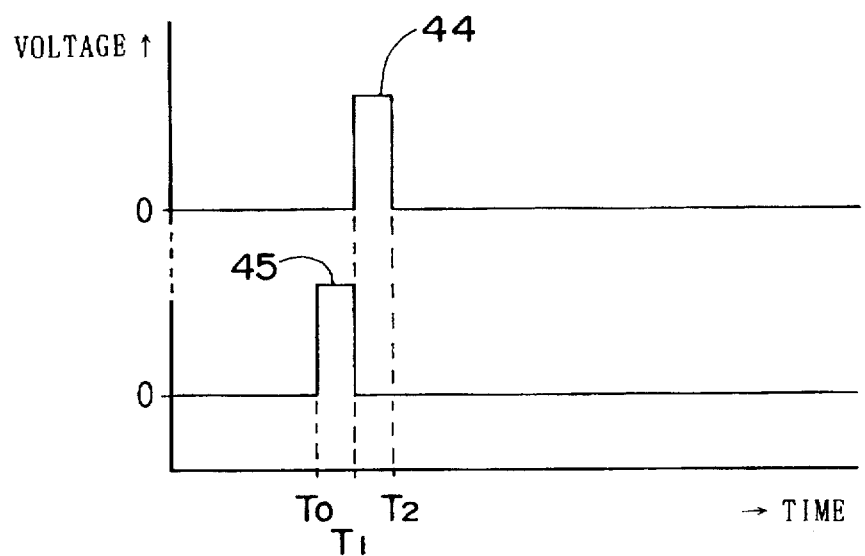
FIG. 11 is a graphical representation showing a deformed reversed polarity signal wave in the polarity distinction circuit.

When the two pulse half-elements are presented in a reverse state as shown in FIG. 9, the minus pulse half-element can be recognized at time T0–T1 and the plus pulse half-element can be recognized at time T1–T2. These pulse half-elements are also preferably turned over in the same way and then deformed into U-shaped ones respectively, the pulse half-elements are presented as a non-reverse output 44 and a reverse output 45 as shown in FIG. 11. Incidentally, the reverse output 45 is first detected at time T0. At this moment, the reversed polarity is now to be acknowledged.

The result display circuit 38 has several LED indicators to display results of the voltage value measurement circuit 32 showing measured voltage values between two of the posts e, n, g, the silence distinction circuit 36 showing the presence of pulse voltage signal from the oscillation device 20 and the polarity distinction circuit 37 showing the straight or reversed polarity. The finished wiring state is now definitely confirmed only when the aforementioned three results are all in a correct state.

While the operation of the device will be obvious to those skilled in the art, a brief explanation of the operation will be given for convenience.

Figure 12:
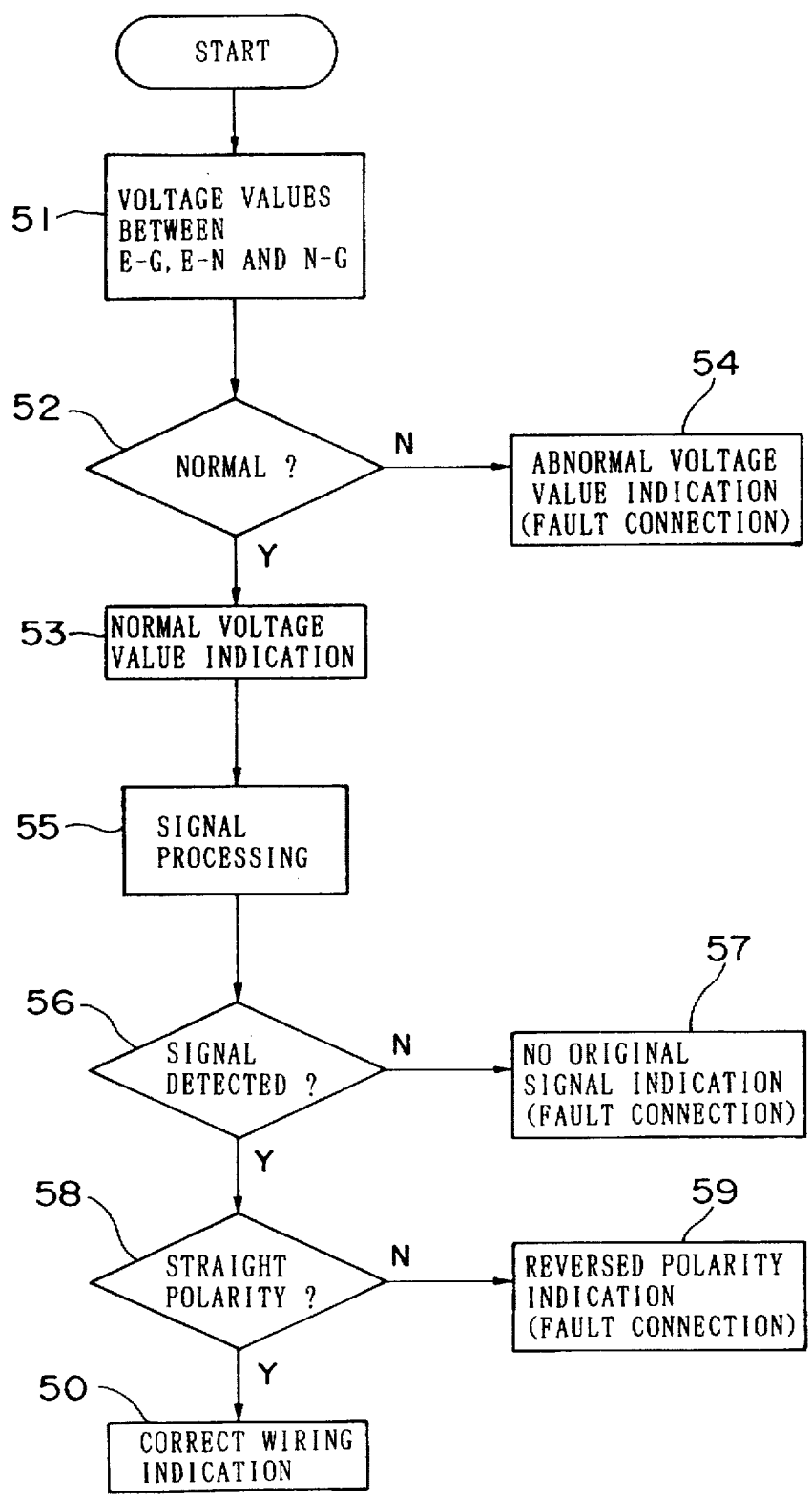
FIG. 12 is a flow-chart showing a determination process according to the present invention.
Figure 13:
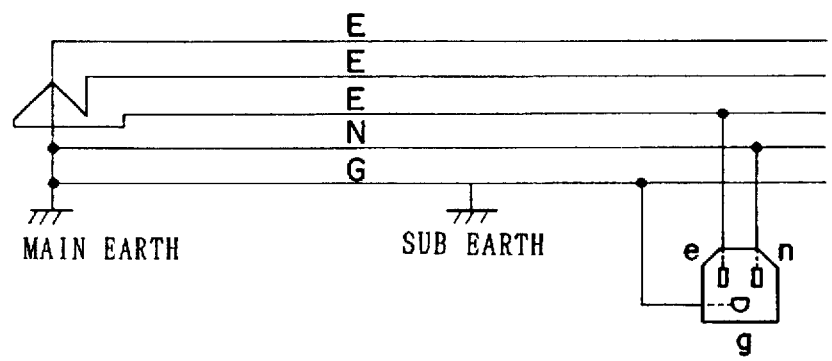
FIG. 13 is a schematic view of a prior wiring state under the three-phase four-wiring system.

In the aforementioned preferred embodiment, a determination of the finished electric wiring state for the mentioned three-terminal post socket 11 will be conducted by following steps shown in FIG. 12 after the electric wiring 10 is kept in a live state, the neutral line N is connected to the oscillation device 20 with its source portion and the discrimination device 30 is also connected to the posts e, n, g of the three-terminal post socket 11.

As the discrimination device 30 runs, respective voltage values between e-g, e-n and n-g are measured (Step 51) and a determination about voltage value will be done with reference to connection combinations shown in Table 1 (Step 52). In this step, several connection combinations showing "RRO" are considered and indicated as to be in a correct state for the present (Step 53). Otherwise, an indication to show an abnormal voltage value is presented for each rest connection combinations (Step 54). Reaching this step, most of fault connection combinations patterns shown in Table 1 can be disappeared.

Next, if the result in the voltage value measurement circuit 32 is fine, the relay circuit 33 functions to connect the coupling cables 31 with the following filter circuit 34 (Step 55) to conduct further signal processing. More specifically, in the silence distinction circuit 36, the presence of the pulse voltage signals originally generated in the oscillation device 20 is confirmed (Step 56) and if the detected signals do not originate from the signals in the device 20, an indication showing that there are no original signals will be indicated (Step 57). In this condition, it can be understood that there are remaining fault connection combinations except "ENG" and "EGN" among "ENN", "ENG", "EGN", "EGG" each showing "RR0", that is, the posts n, g are connected in fault to a same single line to show 0(zero) voltage value.

In the further steps, the polarity tests for the detected signals of the posts n, g compared with the signals from the oscillation device 20 are done in the polarity distinction circuit 37 (Step 58). When the tested signal shows reversed polarity, an indication thereof is preferably done (Step 59), otherwise an indication of correct wiring is shown (Step 50). In a case that an actual connection combination is "EGN", the posts n and g are inversely connected to the lines G and N, so that the polarity of the pulse voltage signals fed into the line N is inversely recognized at the posts n, g. In a case that an actual connection combination is "ENG", it can be understood that the both posts n and g are correctly connected to the lines N and G so that the fed pulse voltage signals can be detected at the posts n and g as in its original state.

In other words, when the posts n and g are normally connected to the lines N and G, the induced voltage signals advances to the post n through the neutral line N preferably, so that the polarity of the induced voltage signals at the post n is the same to those of the pulse voltage signals generated by the oscillation device 20. But, if the posts n and g are connected in fault with the lines G and N, the induced voltage signals reach to the post n through the ground line G, wherein the polarity of the induced voltage signals at the post n is opposed to those of the pulse voltage signals generated by the oscillation device 20. As a result, if the reversed polarity state is indicated, the fault wiring of "EGN" is confirmed and if the straight polarity state is indicated, the correct wiring of "ENG" can be confirmed.

The above-mentioned embodiment of the present invention is intended to achieve the following objects and advantages.

The aforesaid voltage test in the present invention can reduce majority of the fault connection combinations and the remaining fault connection combinations, especially the wiring state for the posts n and g, can be definitely examined by the tests conducted in the silence distinction circuit 36 and the polarity distinction circuit 37. The voltage test prior to the distinction tests in the circuits 36 and 37 is worthy to eliminate connection combinations which do not suit the actual wiring state to thereby accelerate the determination work.

The present invention is carried out in the live electric wiring 10 but does not need current for measurement, whereby unacceptable excessive electric current which may act the protective relay will not be generated. Accordingly, the measuring work can be executed without any interruption of service even if several electrical appliances are used. As has been discussed, the present invention does not require two persons as required in the prior system to conduct the measurement since the necessary work before measurement is only to connect and keep the oscillation device 20 to the neutral line N and to connect between the post socket 11 with the coupling cables 31 extending from the discrimination device 30.

Since the oscillation device 20 generates the pulse voltage signals spreadable entirely to the electric wiring 10, the measurement can be carried out at any point between the source portion and the end portion. This means that the whole measuring work can be accelerated in accordance with the number of accompanied persons.

In this embodiment, as the pulse voltage signal is formed into a combination of two sine wave pulse in practice as shown in FIG. 3, the transient response in the filter circuit 34 of the discrimination device 30 is restrained to reliably detect the pulse signal.

The relay circuit 33 between the posts n, g and the filter circuit 34 is adapted not to transmit high voltage to the devices 34, 35, 36, 37 but to do 0 (zero) or almost 0(zero) voltage to the same only when the voltage value between the posts n and g detected by the voltage value measurement circuit 32 shows such voltage. In the filter circuit 34, since the 50 Hz notch filter first cancels the power supply frequency element before the 5 KHz band pass filter picks up pulse elements 42, the signal measurement is effectively done.

The level control circuit 35 is worthy to control signal level to deform the pulse element 42 into the U-shaped pulse in the polarity distinction circuit 37 and to also amplify the transient response of noise not including the pulse voltage signal to the same level thus to be used in the silence distinction circuit 36. The silence distinction circuit 36 is adapted to distinguish that there is no predetermined signal in the transient response of noise before the test in the polarity distinction circuit 37, so that a fault connection state wherein the posts n, g are connected to a single fault line all together and another fault connection state wherein the posts n, g are inversely connected to the lines G and N can be distinguished each other to thereby quickly amend the fault wiring. In the polarity distinction circuit 37, the fed pulse signal is deformed into the corresponding U-shaped pulse signal to distinguish the polarity of the pulse, the half-element of the U-shaped pulse being preferably reversed in the comparator.

The result display circuit 38 functions to display the respective distinction results concerning voltage, silence and polarity one by one thus to phase to confirm fault connection combinations to thereby accelerate rewiring work.

The invention may be embodied in other specific forms as follows without departing from the spirit or essential characteristics thereof.

The oscillation device 20 was connected to the neutral line N in the aforementioned embodiment but it could be done to the ground line G or to a short-circuit line between the neutral line N and the ground G as long as the pulse voltage signal for measurement is fed and transmitted in the both lines N and G. The trans connection device 21 of the oscillation device 20 could be a known one defined by a core or a ferrite core accompanied with coil, the core state being of a cut ring type. The trans connection device 21 should relate to the neutral line N, but it could be done by another system capable of relating to a point on the neutral line N occasionally in stead of clamping as has been discussed.

Furthermore, the pulse voltage signal generated in the oscillation device 20 could be a triangular wave pulse or a rectangular wave in stead of the single sine wave pulse as far as the generated pulse voltage signal has a pair of straight and reversed elements thereof. As has been explained, though a single pulse was accompanied with the antiphase pulse in the aforementioned embodiment, only the single pulse could be used whenever there is no transient response of the filter circuit 34 by means of another device.

The frequency of the signal generated in the oscillation device 20 is not limited to a value of 5 KHz but also other values, but reviewing a correct recognition, it is recommended not to use the frequencies of between 50–60 Hz and also the frequencies in a switching regulator and a high frequency invertor not to badly influence electrical appliances used. The pulse voltage signal sent from the oscillation device 20 is preferably fed into the neutral line N at regular intervals at which the transient responses are attenuated enough.

The components 32–38 of the discrimination device 30 could be replaced with other assembly without departing from the spirit of the present invention. Taking for an instance, the silence distinction circuit 36 could be a monitoring type for the pulse voltage signal sent by the oscillation device 20 as to substitute for using the transient response of noise.

Furthermore, the polarity distinction circuit 37 could directly distinguish the sine wave pulse without the deformation into the U-shaped pulse if it functions to measure the polarity of the pulse with in a short period of time.

In the discrimination device 30, it does not always need to have the relay circuit 33 if the subsequent circuits after the filter circuit 34 have capacity to receive unacceptable high voltage. The filter circuit 34 and the level control circuit 35 can be omitted if the silence distinction circuit 36 and the polarity distinction circuit 37 may function to directly receive signals from the posts n and g.

The silence distinction circuit 36 may be naturally omitted, if the polarity distinction circuit 37 can distinguish a straight polarity, a reversed polarity or a no polarity to confirm fault connecting combination at posts n and g. However, the silence distinction circuit 36 is preferably to be used in the present invention in order to prevent a fault distinction due to noise with no signal.

Figure 14:
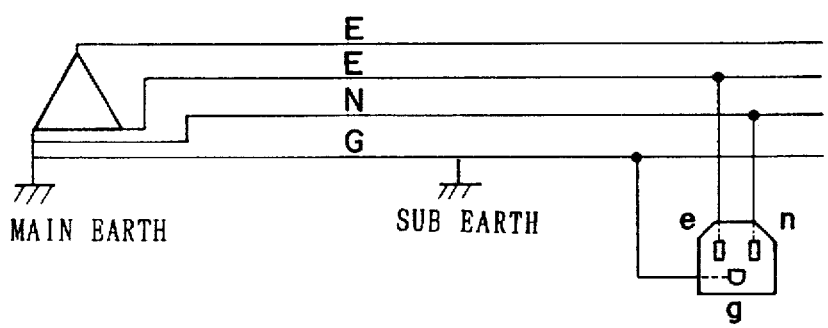
FIG. 14 is a schematic view of a prior wiring state under the three-phase three-wiring system.
Figure 15:
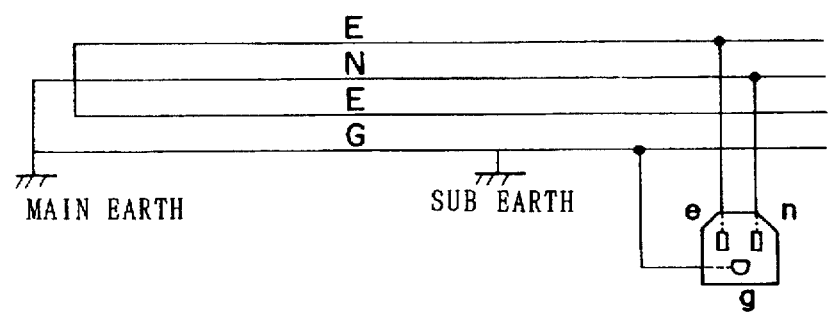
FIG. 15 is a schematic view of a prior wiring state under the single-phase three-wiring system.

As has been mentioned, the present invention is expected to confirm the finished wiring between the lines E, N, G of the electric wiring 10 and the posts e, n, g of the three-terminal post socket 11, but it can be utilized to confirm a connection state between the lines E, N, G and the respective branch lines. In the aforementioned embodiment, the three-phase four-wiring system is subjected to be measured but the three-phase three-wiring system shown in FIG. 14 and the single-phase three-wiring system shown in FIG. 15 are also measured by this determination system 13.

The system 13 can be applied to a shield line for sending signals or control commands, the shield line being short-circuited as in the aforementioned embodiment. As has been mentioned above, the pulse voltage signal fed into the line at its source portion can be detected at the end portion thus to effectively and safely conduct the measurement without any interruption of service.

The invention may be embodied in other specific forms without departing from the spirit or essential characteristics thereof. The present embodiments are therefore to be considered in all respects as illustrative and no restrictive, the scope of the invention being indicated by the appended claims rather than by the foregoing description, and all changes which come within the meaning and range of equivalency of the claims are therefore intended to be embraced therein.

What is claimed is:

1. A method of determining an electric wiring state, comprising the steps of:

feeding at least one pulse voltage signal into one of two lines short-circuited at their two source portions;

detecting the pulse voltage signal at two end portions corresponding to the two source portions; and discriminating wiring state between the two source portions and the corresponding two end portions upon a comparison of polarities between the fed pulse voltage signal and the detected signal.

2. The method of determining an electric wiring state according to claim 1, wherein said discrimination is provided to determine a correct wiring state of the two lines when a polarity of the detected signal is the same to that of the fed pulse voltage signal.

3. The method of determining an electric wiring state according to claim 1, wherein said discrimination is provided to determine a reversed wiring state of the two lines when a polarity of the detected signal is oppose to that of the fed pulse voltage signal.

4. The method of determining an electric wiring state according to claim 1, wherein said discrimination is adapted to discriminate that the two end portions are all connected to one of the two lines when there is no signal detection at the end portions.

5. The method of determining an electric wiring state according to claim 4, wherein the discrimination is conducted before a comparison of polarities between the fed pulse voltage signal and the detected signal.

6. The method of determining an electric wiring state according to claim 5, further comprising, in advance, a step to measure voltage values at end portions connected to the two lines and an electric power line to confirm with the predetermined values.

7. The method of determining an electric wiring state according to claim 1, wherein the fed pulse voltage signal is a sine wave pulse.

8. The method of determining an electric wiring state according to claim 1, wherein the fed pulse voltage signal is a combined sine wave pulse with an antiphase pulse thereof.

9. The method of determining an electric wiring state according to claim 7, wherein the fed pulse voltage signal is formed into a U-shaped pulse.

10. The method of determining an electric wiring state according to claim 1, wherein the pulse voltage signal has a frequency of 5 KHz.

11. An apparatus for determining an electrical wiring state, comprising:

an oscillation device for feeding at least one pulse voltage signal into one of two lines short-circuited at their two source portions;

a discrimination device for detecting the signal at two end portions corresponding to the two source portions and discriminating polarities of the fed pulse voltage signal and the detected signal;

wherein said discrimination device includes a polarity distinction circuit adapted to sense a plus element and minus element of the fed pulse voltage signal from the two end portions to thereby distinguish a straight polarity when the order of the elements are the same to that from said oscillation device and a reversed polarity when the order of the elements are opposed to that from said oscillation device;

a silence distinction circuit to compare the signal from the lines with the pulse voltage signals from said oscillation device to thereby issue a discrimination as there is no signal when it does not have a confirmation that the pulse signals originates from said oscillation device; and a voltage value measurement circuit adapted to confirm voltage values at end portions connected to the two lines and an electric power line with predetermined values.

12. The apparatus for determining an electrical wiring state according to claim 11, wherein said oscillation device includes a trans connection device to feed the pulse voltage signal in one of the two lines in a clamping state of the line.

13. A method of determining an electric wiring state in at least first and second electrical lines having first and second source portions and end portions, comprising the steps of:

feeding at least one pulse voltage signal into one of the at least first and second electrical lines, the first and second source portions being short-circuited to ground potential, and the one of the at least first and second electrical lines conducting the at least one pulse voltage signal in first and second directions as first and second pulse signals;

detecting the first and second pulse signals at the first and second end portions of the at least first and second electrical lines, respectively; and discriminating the electric wiring state between the first and second source portions and the first and second end portions by comparing a difference in polarity between the first and second pulse signals and the at least one pulse voltage signal.

14. The apparatus for determining an electrical wiring state according to claim 11, wherein said discrimination device has a filter circuit to cancel a power supply frequency element generated in the lines.

15. The apparatus for determining an electrical wiring state according to claim 14, wherein said discrimination device is located between the filter circuit and the end portions and has a relay circuit to connect between the end portions at predetermined voltage value.

16. The apparatus for determining an electrical wiring state according to claim 15, wherein the predetermined voltage value is 0 (zero).

17. The method of determining an electric wiring state according to claim 13, wherein the first and second pulse signals comprise a sinusoidal wave, and the first and second pulse signals are out of phase with each other.

18. A system for determining an electric wiring state in first and second conductors having first and second source portions and end portions, the first and second source portions being short-circuited to ground potential, comprising:

an oscillator connected to one of the first and second conductors, generating a pulse signal conducted by the one of the first and second conductors in first and second directions as first and second pulse signals;

a voltage measure circuit connected to said first and second conductors, detecting the first and second pulse signals at the first and second end portions of the first and second conductors, respectively; and means for discriminating the electric wiring state between the first and second source portions and the first and second end portions by comparing a difference in polarity between the first and second pulse signals and the pulse signal.

19. The system for determining an electric wiring state according to claim 18, wherein the first and second pulse signals comprise a sinusoidal wave, and the first and second pulse signals are out of phase with each other.

* * * * *